(12) United States Patent
Mallia et al.

(10) Patent No.: US 7,643,291 B2
(45) Date of Patent: Jan. 5, 2010

(54) CABINET FOR ELECTRONIC EQUIPMENT

(75) Inventors: Michael Mallia, Northport, NY (US); James Fulton, Patchogue, NY (US)

(73) Assignee: AFCO Systems, Farmingdale, NY (US)

( * ) Notice: Subject to any disclaimer, the term of this patent is extended or adjusted under 35 U.S.C. 154(b) by 0 days.

(21) Appl. No.: 12/231,149

(22) Filed: Aug. 29, 2008

(65) Prior Publication Data

US 2009/0059523 A1    Mar. 5, 2009

Related U.S. Application Data

(60) Provisional application No. 60/966,892, filed on Aug. 30, 2007.

(51) Int. Cl.
*H05K 7/20* (2006.01)
(52) U.S. Cl. ............... 361/695; 361/687; 361/690; 165/104.33; 454/184
(58) Field of Classification Search ............. 361/687, 361/690, 695; 165/104.33
See application file for complete search history.

(56) References Cited

U.S. PATENT DOCUMENTS

| | | | |
|---|---|---|---|
| 3,348,609 A | 10/1967 | Dubin et al. | |
| 4,016,357 A | 4/1977 | Abrahamsen | |
| 4,458,296 A | 7/1984 | Bryant et al. | |
| 5,422,787 A | 6/1995 | Gourdine | |
| 5,718,628 A * | 2/1998 | Nakazato et al. | 454/184 |
| 6,088,224 A | 7/2000 | Gallagher et al. | |
| 6,104,003 A | 8/2000 | Jones | |
| 6,151,212 A | 11/2000 | Schwenk et al. | |
| 6,185,098 B1 | 2/2001 | Benavides | |
| 6,341,064 B1 | 1/2002 | Bradley | |
| 6,459,579 B1 * | 10/2002 | Farmer et al. | 361/695 |
| 6,462,944 B1 | 10/2002 | Lin | |
| 6,494,050 B2 * | 12/2002 | Spinazzola et al. | 62/89 |
| 6,554,697 B1 * | 4/2003 | Koplin | 454/184 |
| 6,611,428 B1 | 8/2003 | Wong | |
| 6,643,123 B2 | 11/2003 | Hartel et al. | |
| 6,678,156 B2 | 1/2004 | Moizer | |
| 6,742,583 B2 | 6/2004 | Tikka | |
| 6,776,707 B2 | 8/2004 | Koplin | |
| 6,876,549 B2 * | 4/2005 | Beitelmal et al. | 361/692 |

(Continued)

FOREIGN PATENT DOCUMENTS

EP    0 741 269 A    11/1996

(Continued)

*Primary Examiner*—Boris L Chervinsky
(74) *Attorney, Agent, or Firm*—Dilworth & Barrese, LLP

(57) ABSTRACT

An electronic equipment cabinet is provided, which includes an upper portion, a lower portion and a support configured to receive electronic equipment. The bottom portion defines a base plenum configured to receive a low temperature gas and communicates with a gas flow distribution pathway, which includes a first plenum communicating with the base plenum and configured to direct the low temperature gas to the support. The gas flow distribution pathway further includes a second plenum configured to receive a high temperature gas flow from the support and direct the high temperature gas flow to the top portion. The top portion includes at least one fan configured to direct the high temperature gas flow from the gas flow distribution pathway. A temperature sensor senses the temperature of the high temperature gas flow and communicates with a control module to control the first plenum and the at least one fan for regulating temperature.

18 Claims, 13 Drawing Sheets

U.S. PATENT DOCUMENTS

| | | | |
|---|---|---|---|
| 7,011,576 B2 * | 3/2006 | Sharp et al. | 454/184 |
| 7,031,154 B2 * | 4/2006 | Bash et al. | 361/690 |
| 7,033,267 B2 * | 4/2006 | Rasmussen | 454/184 |
| 7,182,208 B2 | 2/2007 | Tachibana | |
| 7,187,547 B1 | 3/2007 | French et al. | |
| 7,209,351 B2 * | 4/2007 | Wei | 361/695 |
| 7,226,353 B2 | 6/2007 | Bettridge et al. | |
| 7,295,444 B1 * | 11/2007 | Wang | 361/752 |
| 7,508,663 B2 * | 3/2009 | Coglitore | 361/695 |
| 2004/0132398 A1 | 7/2004 | Sharp et al. | |
| 2005/0168945 A1 | 8/2005 | Coglitore | |
| 2005/0237716 A1 | 10/2005 | Chu et al. | |
| 2006/0044758 A1 | 3/2006 | Spangberg | |
| 2006/0103504 A1 | 5/2006 | Vassallo | |

FOREIGN PATENT DOCUMENTS

| | | |
|---|---|---|
| EP | 1017263 B1 | 7/2000 |
| WO | WO 01/86217 A | 11/2001 |

* cited by examiner

CABINET FOR ELECTRONIC EQUIPMENT

CROSS-REFERENCE TO RELATED APPLICATION

The present application claims priority to U.S. Provisional Application Ser. No. 60/966,892 filed Aug. 30, 2007, which is herein incorporated by reference in its entirety.

BACKGROUND

1. Field of the Invention

This invention relates generally to cabinet systems for housing and maintaining electronic equipment. More specifically, the present disclosure is directed to a cabinet system having a gas flow distribution configuration that regulates temperature for monitoring and controlling conditions of the system, including cooling of heat generating electronic components.

2. Background of the Art

Cabinets for storing of electronic equipment are well known. These cabinets can be designed to enclose and store electronic equipment on racks in a vertical arrangement. The electronic equipment may include computers, data servers, storage systems, communication systems, audio/video components, etc.

These cabinets may also be configured to store blade servers, which are single circuit boards populated with components, such as, processors, memory and network connections. The cabinet can include enclosures or slots for receiving the blades.

It is desirable for the efficient operation of the electronic equipment, such as blade servers, to maintain an acceptable working temperature within the cabinet and avoid overheating of the electronic equipment. However, the electronic equipment stored in the cabinet typically generate heat during operation, and for example, the chassis of a blade server can create substantial amounts of heat thereby greatly increasing the heat load in the cabinet. This heat load causes an increase in the internal temperature of the cabinet. This temperature eventually exceeds the acceptable working temperature for the electronic equipment, resulting in overheating. Overheating of the electronic equipment can lead to equipment error, failure, shutdown, damage, shortened life and low reliability.

Various prior attempts have been made to overcome the drawbacks associated with the excessive heat loads and/or accumulation of heat generated during operation of electronic equipment stored in a cabinet. One attempt places several such cabinets in a room, which is air conditioned or supplied with ducted cool air. This attempt, however, suffers from several disadvantages such as the requirements of cooling the entire room and its contents, the adverse effect of one cabinet temperature relative to another, and the inability to upgrade electronic equipment because the cooling capacity has reached its maximum.

Other attempts include cabinet designs having multiple front and rear access openings, which may include fan units. These designs disadvantageously have difficulty maintaining uniform temperature within the cabinet due to greater amounts of heat being found at the top of the cabinet resulting in temperature gradients from the top to the bottom of the cabinet. In these cases, the equipment located near the top is more prone to failure from overheating.

Still other attempts include ducted cool air assemblies. However, these designs do not account for temperature gradients or provide reliable temperature regulation. In some cases, these designs are configured for an initial equipment load and programmed to operate at full capacity, regardless of the heating load. Thus, these cooling designs are in effect static and unable to accommodate load changes. In the event of equipment failure or discontinuity, many industries cannot afford down time to accommodate changes. Further, these designs can disadvantageously waste power and cooling capacity.

Therefore, it would be desirable to overcome the disadvantages and drawbacks of the prior art with a cabinet for housing and maintaining electronic equipment, which includes a system having a gas flow distribution configuration that regulates temperature, as well as related methods of use. Further, it would be desirable if the cabinet and related methods can accommodate increased density of equipment and high heat loads while providing cooling efficiency. It is most desirable that the cabinet provides a dynamic cooling system to accommodate additional equipment, or modified equipment, and/or changing heat loads such that the temperature regulation and associated cooling can be modified during use of the equipment without shutdown. It is contemplated that the cabinet of the present disclosure is easily and efficiently manufactured and assembled.

SUMMARY

Accordingly, a cabinet for housing and maintaining electronic equipment including a system having a gas flow distribution configuration that regulates temperature is disclosed with related methods of use, which overcome the disadvantages and drawbacks of the prior art. The system monitors and controls conditions of the cabinet including cooling of heat generating electronic components disposed therewith. The system monitors and controls conditions of the cabinet including cooling of heat generating electronic components disposed therewith. Desirably, the cabinet and related methods can accommodate increased density of equipment and high heat loads while providing cooling efficiency. The cabinet and related methods of use may be advantageously employed to provide a dynamic cooling system to accommodate additional equipment, modified equipment, and/or changing heat loads such that temperature regulation and associated cooling can be modified during use of the equipment without shutdown. It is envisioned that the cabinet is easily and efficiently manufactured and assembled.

It would be desirable if the cabinet controls airflow from a plenum floor and regulates, either manually or automatically, the amount of supply coming from a supply air system into each enclosure relative (or proportionate) to the server's power requirements and heat load. It would be most desirable if the cabinet controls the mix of room air with a colder air system delivered from the supply air system taking advantage of the room air, thus maximizing and optimizing the overall cooling capacity, simultaneously providing the room with an overall system that balances the room cooling. This provides a narrow band width of temperatures across the room resulting in a much narrower bandwidth of server intake temperatures. In order to achieve this type of control and balance, the cabinet may also provide the room and supply air mixture to the heat coming from the exhaust of all the servers. This exhaust air can be collected at the rear of the cabinet in a plenum, which is managed by a system that enables the cabinet to properly mix the elevated server exhaust air with the cooling supply and from air mixture to a desired state. The desired state can be within the specifications of a computer room air conditioner (CRAC) or a computer room air handler (CRAH) for that component or the overall system as designed per cooling of the entire data center facility.

In one particular embodiment, in accordance with the principles of the present disclosure, an electronic equipment cabinet is provided. The electronic equipment cabinet includes an enclosure defining an interior space. The cabinet has an upper portion and a lower portion. A support is disposed with the interior space and configured to receive electronic equipment. The bottom portion defines a base plenum configured to receive a low temperature gas. The base plenum communicates with a gas flow distribution pathway of the enclosure. The gas flow distribution pathway includes a first plenum communicating with the base plenum and configured to direct the low temperature gas to the support. The gas flow distribution pathway further includes a second plenum configured to receive a high temperature gas flow from the support and direct the high temperature gas flow to the top portion of the enclosure.

The top portion of the enclosure includes at least one fan configured to direct the high temperature gas flow from the gas flow distribution pathway. A temperature sensor is disposed with the enclosure to sense the temperature of the high temperature gas flow adjacent the top portion of the enclosure. A control module is configured to receive temperature sensing data from the temperature sensor to control the first plenum and the at least one fan for regulating temperature of the high temperature gas flow.

The enclosure can include a front wall and a rear wall. The front wall may include a baffle configured to regulate gas flow from outside of the enclosure to the gas flow distribution pathway in the first plenum in a mixture with the low temperature gas flow.

The baffle may be configured to regulate the flow of ambient air. The baffle can include a mesh front door of the front wall. The baffle may be regulated by the control module.

The support may include shelving configured to receive electronic equipment. Desirably, the support is configured to receive at least one blade server chassis, and may be configured to receive a plurality of blade server chassis. The base plenum can include at lease one adjustable opening configured to regulate low temperature gas flow. Desirably, the control module controls the at least one adjustable opening.

The top portion can include a cable trough. The base plenum can include a plurality of adjustable openings configured to regulate low temperature gas flow. The at least one adjustable opening may be a grommet with an adjustable aperture. The top portion of the enclosure may include a plurality of fans. The rear wall can include a gas intake passageway disposed adjacent to the bottom portion of the enclosure. The gas intake passageway is configured to receive ambient air and direct the ambient air to the second plenum. The base plenum can communicate with the second plenum for directing low temperature gas therein. Alternatively, the gas flow distribution pathway is configured to direct the high temperature gas flow, the low temperature gas flow and the ambient air in a mixture of exhaust gas flow in the second plenum such that the temperature sensor serves the temperature of the exhaust gas flow. The gas intake passageway may include a grill, mesh, vent of other structure specifically configured to allow the flow of gas such as ambient air therethrough.

In another embodiment, a method for maintaining electronic equipment at a predetermined temperature is disclosed. The method includes the steps of providing an electronic equipment cabinet, similar to that described herein; drawing ambient air through the baffle into the first plenum; drawing low temperature gas through the base plenum into the first plenum; mixing the low temperature gas with the ambient air in the first plenum; drawing the mixed low temperature gas and the ambient air across the support such that a high temperature gas is drawn into the second plenum; drawing ambient air through an intake grill disposed adjacent a bottom portion of the enclosure and into the second plenum; drawing low temperature gas through the base plenum into the second plenum; mixing the ambient air, the low temperature gas and the high temperature gas in the second plenum; drawing the mixed ambient air, low temperature gas and the high temperature gas from the second plenum with the at least one fan; sensing the temperature of the gas flow drawn from the second plenum; and controlling the temperature of the exhaust gas with the control module based on the temperature sensing data.

The cabinet can be designed to handle heat loads of up to 24 kW in an effort to avoid the increased maintenance associated with water-cooled enclosures. The cabinet can be used with blade technology based, for example, on a rear plenum extension to handle high-pressure airflow associated with the blade chassis. The cabinet can be configured for extreme, high-density applications with thermal control achieved through continuous monitoring and management of exhaust temperatures and fan speed regulation through voltage modulation. This, in conjunction with adjustable plenum apertures and a vertical exhaust plenum compartment, maintains the desired cabinet enclosure temperature set point.

The cabinet can be employed with extreme high density applications, which utilize air-cooled technology of the present disclosure to accommodate blade servers' extremely high densities. The cabinet system provides a datacenter manager control of air temperature at the cabinet enclosure level. This cabinet system can actively monitor and balance internal heat loads, utilizing under-floor cool air and ambient computer room temperature, advantageously ensuring a stable and reliable operating environment. The cabinet system can also communicate with a resource manager, which reads the enclosure, displays equipment status and creates alarm and event notifications.

The cabinet system of the present disclosure may provide several features and benefits. The cabinet system can simulate standard datacenter design and handle heat loads of up to six 7RU (rack unit) blade chassis. The cabinet system can deliver improved server inlet temperatures with increased cooling over hot aisle/cold aisle, chimney, cold aisle containment, hot aisle containment, in-row cooling, overhead cooling designs and other design approaches, and requires dramatically less power.

The cabinet system includes a thermal management module that provides control and reporting of thermal and power conditions, which includes a micro computer system and multi-sensor architecture. The rear plenum, along with a plurality of variable-speed fans, automatically adjusts to varying heat loads. The configuration dissipates return air back to the CRAH within performance requirements of a particular application. It is contemplated one or a plurality of fans, for example, 10 fans may be used, such that a sufficient generation of cubic feet per minute (CFM) of air is moved as required by the heat load for heat dissipation for a system. For example, an 8 kilowatt (kW) heat load can utilize a 1300 CFM fan system. A 16 kW heat load can utilize a 2,000 CFM fan system. A 24 kW heat load can utilize a 3,000 CFM system. Each system may include a variable speed fan module that provides sufficient CFM to dissipate heat loads according to cabinet system capacity.

In an alternate embodiment, the base plenum plate of the cabinet includes six adjustable airflow apertures designed to provide static pressure control of the raised floor. The apertures communicate airflow providing gas flow distribution management that delivers cool air for a set time, cabinet location and quantity needed. The rear plenum is designed to handle high turbulence and increased heat loads from a blade chassis. The cabinet includes a door baffle system, which emphasizes thermal performance and airflow management. This advantageous configuration promotes a mix of room air with plenum air for increased heat dissipation and room balancing while preventing the short cycling of fans. The base plenum plate can include one or a plurality air flow apertures.

The cabinet system of the present disclosure provides a thermal platform configuration designed to accommodate high densities and optimize performance and flexibility when deploying blade centers. The system includes a gas flow distribution configuration having a fan placement to handle high turbulence and heat loads generated from blade chassis. The cabinet system allows for control and flexibility and has superior performance without requiring blanking plates.

In an alternate embodiment, the cabinet system is designed to handle heat loads up to a 16 kW rear plenum extension to handle blade chassis' high-pressure airflow in a configuration for extreme, high-density applications. This design provides thermal control through continuous monitoring and management of exhaust temperatures and fan speed regulation through voltage modulation. This, in conjunction with the adjustable plenum apertures and vertical exhaust plenum compartment, maintains the desired enclosure temperature set point.

The cabinet monitors and balances internal heat loads, utilizing under-floor cool air and ambient computer room temperature, ensuring a stable and reliable operating environment.

BRIEF DESCRIPTION OF THE DRAWINGS

The above-mentioned and other features and objects of this disclosure, and the manner of attaining them, will become more apparent and the disclosure itself will be better understood by reference to the following description of embodiments of the disclosure taken in conjunction with the accompanying drawings, wherein.

DETAILED DESCRIPTION OF PREFERRED EMBODIMENT(S)

The exemplary embodiments of the cabinet system and methods of use disclosed are discussed in terms of housing and maintaining electronic equipment and more particularly, in terms of a cabinet system having a gas flow distribution configuration that regulates temperature for monitoring conditions of the system. The system includes cooling of heat generating electronic components. It is envisioned that the present disclosure may be employed with a range of applications including various types of electronic equipment. The electronic equipment may include computers, data servers, storage systems, communication systems, audio/video components, telecommunication equipment, etc. It is envisioned that the present disclosure may be employed with blade server technology. It is further envisioned that the present disclosure may be used as a dynamic cooling system to accommodate additional equipment, modified equipment, and/or changing heat loads. The temperature regulation and associated cooling of the present disclosure can be modified during use of the electronic equipment.

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention. Also, as used in the specification and including the appended claims, the singular forms "a," "an," and "the" include the plural, and reference to a particular numerical value includes at least that particular value, unless the context clearly dictates otherwise. Ranges may be expressed herein as from "about" or "approximately" one particular value and/or to "about" or "approximately" another particular value. When such a range is expressed, another embodiment includes from the one particular value and/or to the other particular value. Similarly, when values are expressed as approximations, by use of the antecedent "about," it will be understood that the particular value forms another embodiment.

Figure 1:
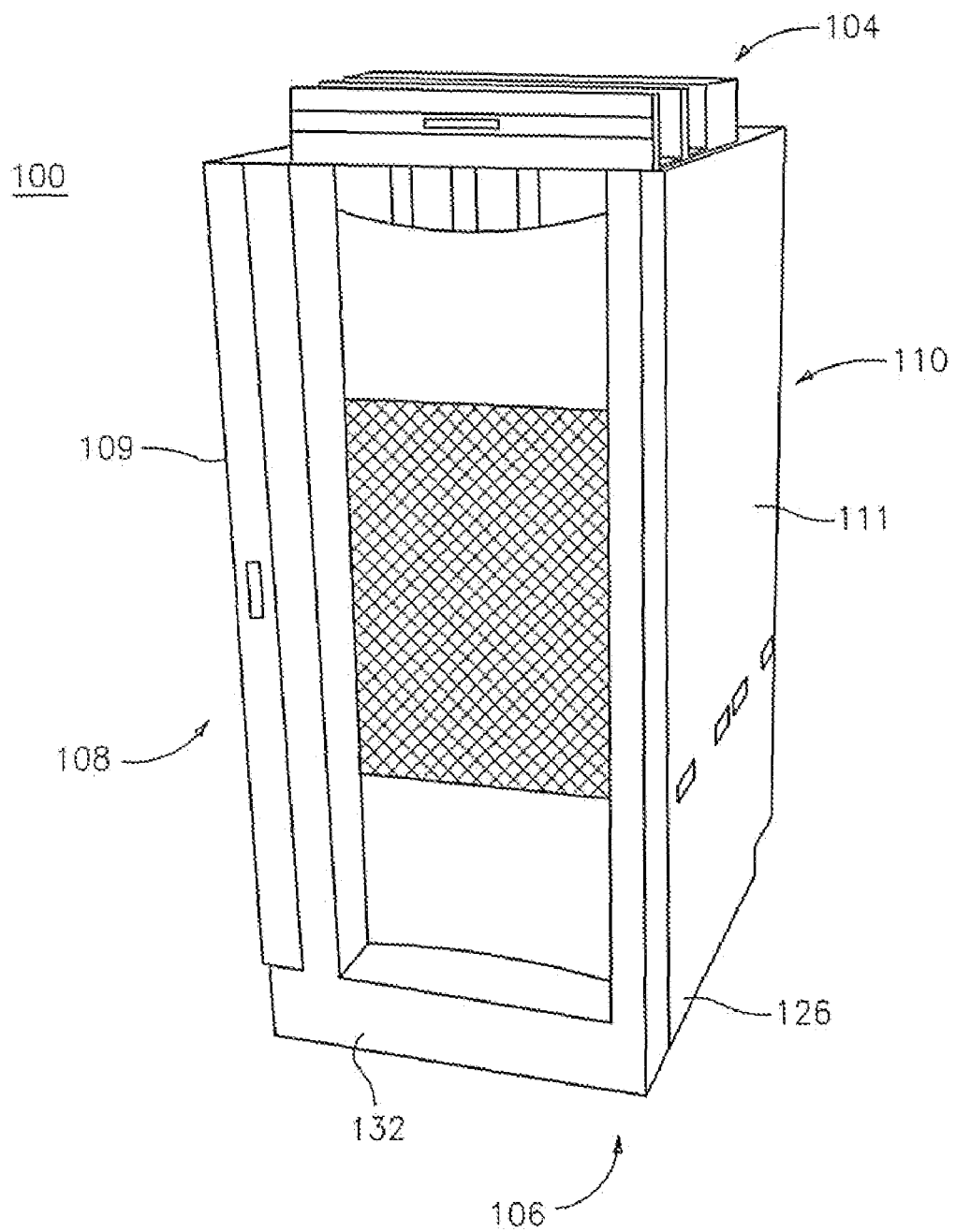
FIG. 1 is a front perspective view of one particular embodiment of a cabinet system in accordance with the principles of the present disclosure.
Figure 2:
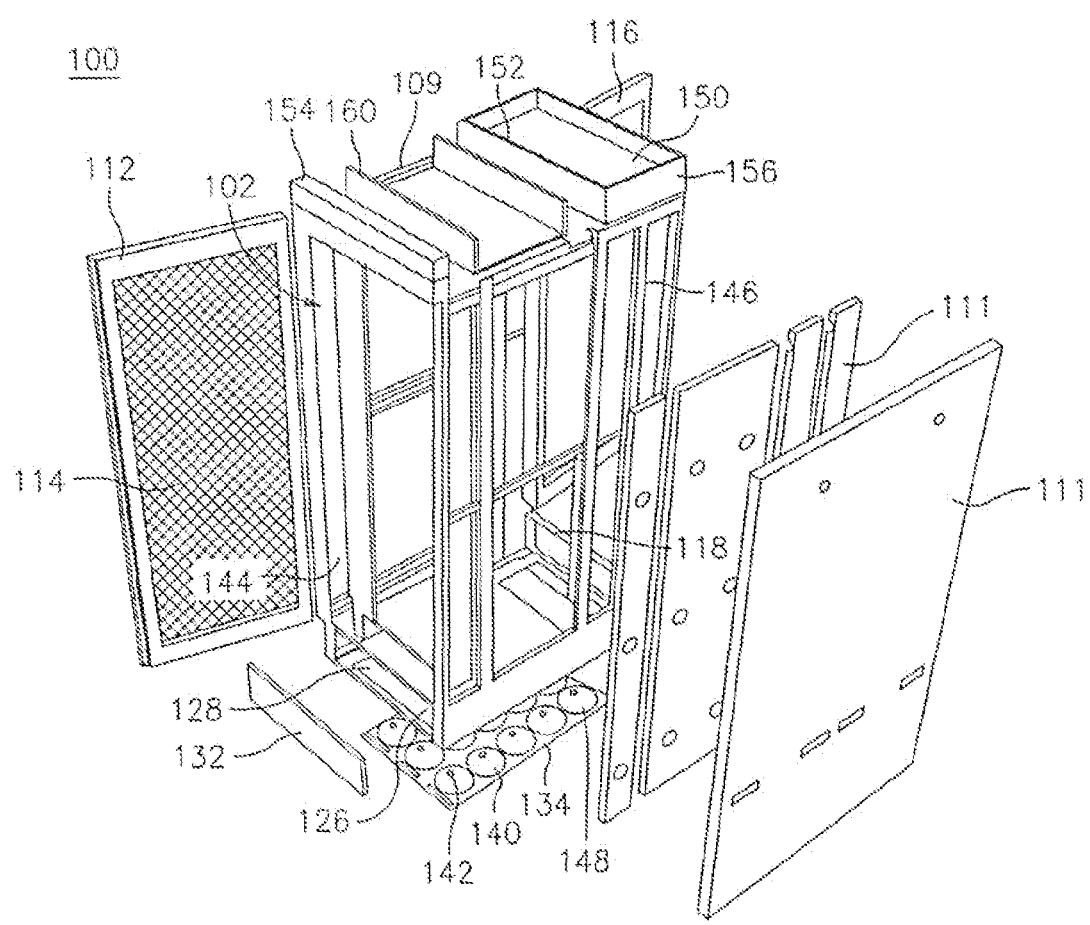
FIG. 2 is a front perspective view of the cabinet system shown in FIG. 1 with parts separated.
Figure 3:
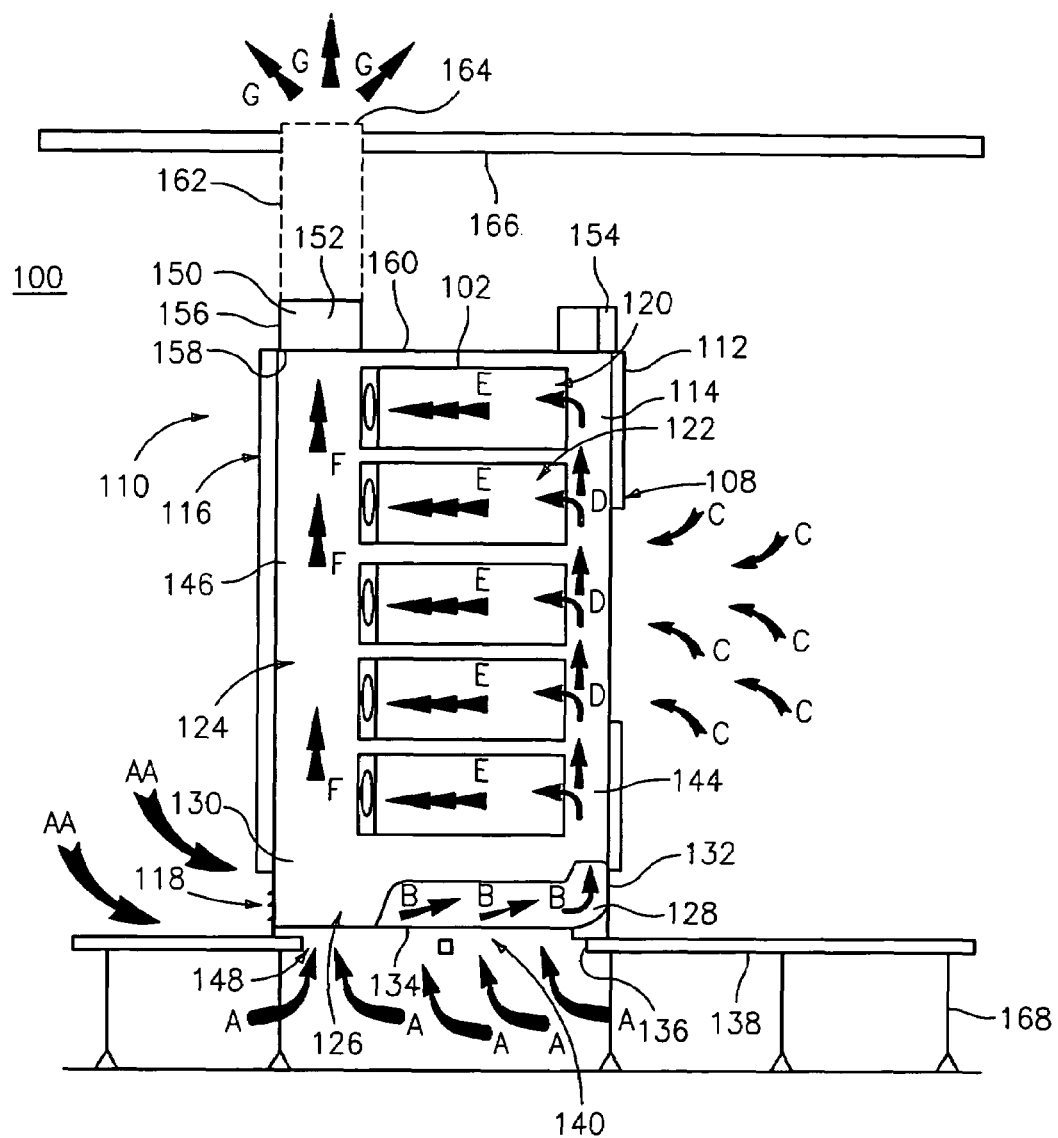
FIG. 3 is a gas flow distribution diagram for the cabinet system shown in FIG. 1.

The following discussion includes a description of an electronic equipment cabinet having a gas flow distribution configuration, related components and exemplary methods of employing the cabinet in accordance with the principles of the present disclosure. Alternate embodiments are also disclosed. Reference will now be made in detail to the exemplary embodiments of the present disclosure, which are illustrated in the accompanying figures. Turning now to FIGS. 1-3, there is illustrated an electronic equipment cabinet 100 having a gas flow distribution configuration in accordance with the principles of the present disclosure.

The components of electronic equipment cabinet 100 are fabricated from materials suitable for electronic equipment housing and maintenance applications, such as, for example, polymerics and/or metals, depending on the particular application and/or preference. Semi-rigid and rigid polymerics are contemplated for fabrication, as well as resilient materials, such as molded polyurethane, polypropylene, etc. The fan motors, electronics and power components of cabinet 100 may be fabricated from those suitable for an electronic equipment housing and maintenance application and in particular, cooling. Cabinet 100 may also include circuit boards, circuitry, processor components, etc. for computerized control. One skilled in the art, however, will realize that other materials and fabrication methods suitable for assembly and manufacture, in accordance with the present disclosure, also would be appropriate.

Cabinet 100 is an enclosure, which includes an interior space 102. Interior space 102 is defined by a top portion 104, a bottom portion 106, a front wall 108 and a rear wall 110. Cabinet 100 also includes side walls 109, 111. Interior space 102 is configured and sufficiently dimensioned for disposal of components of cabinet 100. Cabinet 100 may include shelving and/or racks for support of electronic equipment according to the particular application. It is contemplated that interior space 102 may have various geometric configurations. It is further contemplated that interior space 102 may be continuous within cabinet 100 or separated into a plurality of sections within cabinet 100.

Front wall 108 includes a front door 112. Front wall 112 includes a baffle 114, which regulates ambient air flow into cabinet 100, as will be discussed. Baffle 114 includes a mesh screen and a separate panel for covering a portion of the mesh screen to regulate air flow through the mesh screen. The separate panel can cover all or only a portion of the mesh screen, depending on the requirements of a particular application. It is envisioned that baffle 114 can be adjustable via processor control as is known to one skilled in the art, for air flow regulation. The components of baffle 114 may be variously configured such as rectangular, arcuate, polygonal, perforated, etc., and/or vary in thickness. Baffle 114 may also be sized to encompass substantially all of front door 112, or only a portion thereof. Front door 112 may include gas impervious portions adjacent baffle 114 and/or baffle 114 may be slideably adjustable. It is contemplated that baffle 114 may be manually adjustable. It is further contemplated that baffle 114 may be monolithically formed with a separate panel, integrally connected, or not include a separate panel. Front door 112 may also only include a solid panel and not a screen.

Rear wall 110 includes a rear door 116, which is gas impervious. Rear wall 110 also includes a gas intake passageway, such as, for example, an intake grill 118 disposed below rear door 116, with bottom portion 106. Intake grill 118 regulates ambient air flow into cabinet 100, as will be discussed. The gas intake passageway may be vented, perforated, screened, etc. Cabinet 100 may or may not include a gas intake passageway. It is contemplated that substantially all of rear wall 110 is gas impervious, or only a portion thereof. It is envisioned that intake grill 118, may be variously configured and dimensioned, and/or variously disposed about rear wall 110, accordingly to the requirements of a particular application. Front door 112 and rear door 116 or portions thereof may be transparent, opaque or varying degrees therebetween.

Baffle 114 advantageously enhances thermal performance and airflow management of cabinet 100. This configuration promotes a mix of room air with plenum air, as will be discussed, for increased heat dissipation and room balancing while preventing the short cycling of fans.

A plurality of racks 120 are disposed within interior space 102 and configured to support blade server chassis' 122. Racks 120 are slidably mounted with cabinet 100, as is known to one skilled in the art. It is contemplated that racks 120 may support various types of electronic and/or telecommunication equipment such as computers, data servers, storage systems, communication devices, audio/video components, etc. It is envisioned that cabinet 100 is configured to support electronic equipment that can generate various amounts of heat load, including high density and extreme high density applications. For example, heat loads of up to 24 kW or more are envisioned.

Bottom portion 106 communicates with a gas flow distribution pathway 124 of cabinet 100. Bottom portion 106 includes a base plenum 126, which is configured to receive a low temperature gas, such as, for example, cooled or chilled air from an air conditioning unit, as is know to one skilled in the art. Base plenum 126 can be disposed adjacent or mounted with a vent or opening 136 of a floor 138, which defines a cavity or a duct 168 for the passage of the cooled air. Cool air is supplied from an air conditioning unit into base plenum 126. It is contemplated that cabinet 100 may be employed in a room having a solid floor (no openings) or raised on legs. In such cases, ambient air is drawn, or cooling unit may supply cool air via side openings connected to the plenums, or in the case of a leg raised cabinet, a cooling duct may similarly connect with base plenum 126. It is contemplated that the low temperature gas may be supplied in a temperature range of 50-70 degrees Fahrenheit (F). Other temperature ranges are also contemplated according to the requirements of a particular cabinet application.

Base plenum 126 has a front section 128 and a rear section 130. Front section 128 and rear section 130 are each configured to divert and direct the cool air from duct 168 to a desired location of cabinet 100. Bottom portion 106 includes a plenum cover 132 to enclose base plenum 126.

Bottom portion 106 also includes a base panel 134, which is mounted to enclose base plenum 126 and provide a conduit with the cool air from duct 168. Base panel 134 is disposed with opening 136 and includes a plurality of adjustable openings, such as, for example, front grommets 140 and rear grommets 148, which include adjustable apertures 142 configured to regulate the flow of cool air into plenum 126. It is envisioned that apertures 142 may be processor controlled for gas flow regulation. It is contemplated that apertures 142 may be manually adjusted. Apertures 142 may be variously configured and sized including various geometric configurations, such as, circular, rectangular, etc., and may include nozzles, according to the requirements of a particular application.

Figure 3A:
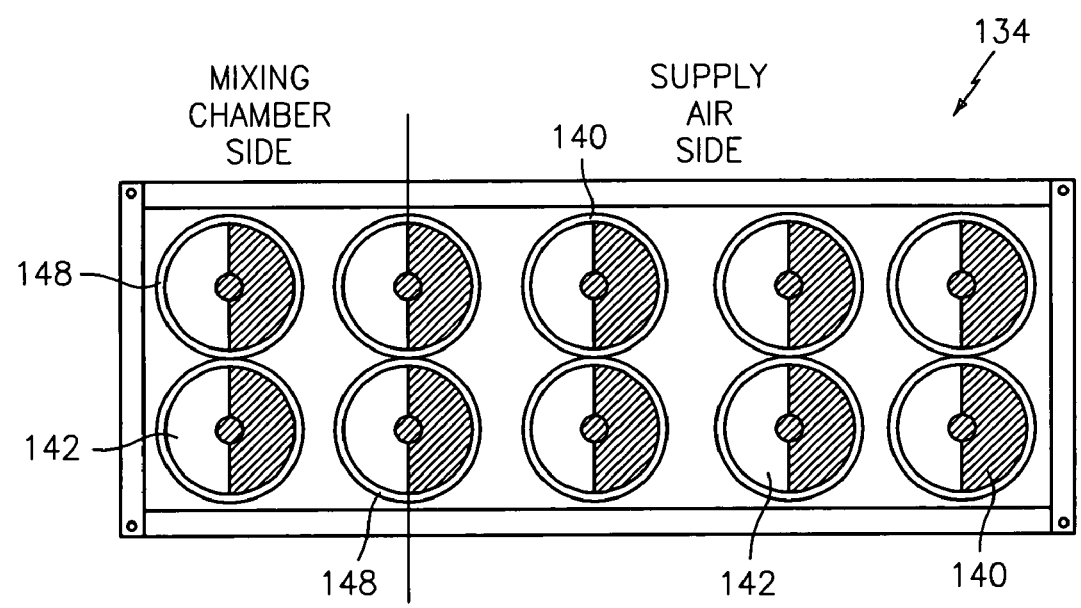
FIG. 3A is a plan view of one particular embodiment of a base panel of the cabinet system shown in FIG. 1.

For example, in one particular embodiment as shown in FIG. 3A, base panel 134 has 10 grommets including six (6) front grommets 140 and four (4) rear grommets 148. Grommets 140, 148 are in the fully open position and define an open area of approximately 13-13.25 square inches, resulting in a total open area of approximately 132 square inches. Apertures 142 have a semi or half circle configuration. In this grommet 140, 148 configuration, on the mixing chamber side corresponding to rear plenum 146, an air volume in a range of 147-1040 CFM with a respective static pressure in a range of 0.01-0.5 inches $H_2O$ is provided. On the supply air side corresponding to front plenum 144, an air volume in a range of 221-1561 CFM with a respective static pressure in a range of 0.01-0.5 inches $H_2O$, is provided.

Figure 3B:
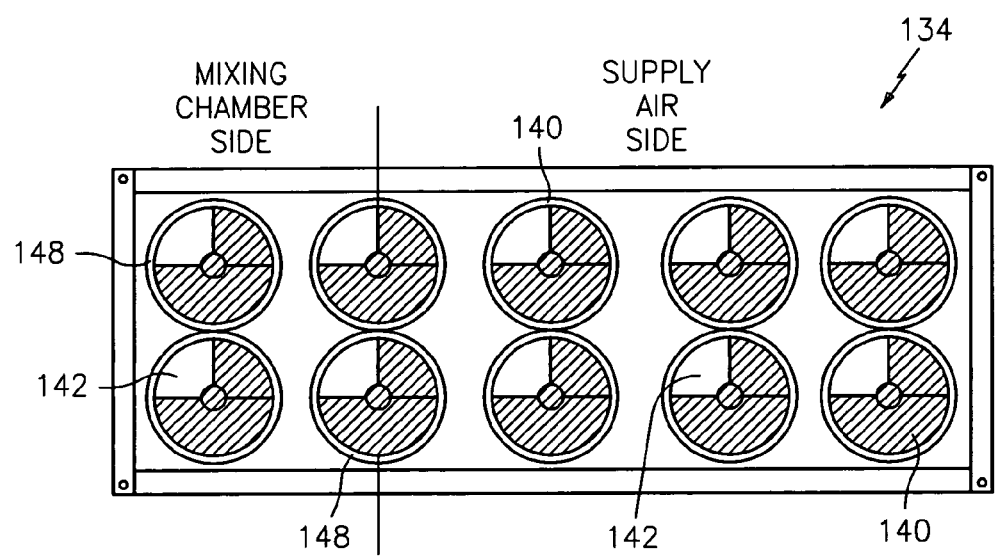
FIG. 3B is a plan view of alternate embodiment of the base panel shown in FIG. 3A.

In another embodiment as shown in FIG. 3B, grommets 140, 148 are in the half open position and define an open area of approximately 5-5.34 square inches, resulting in a total open area of approximately 53.4 square inches. In this grommet 140, 148 configuration, on the mixing chamber side corresponding to rear plenum 146, an air volume in a range of 59-420 CFM with a respective static pressure in a range of 0.01-0.5 inches $H_2O$, is provided. On the supply air side corresponding to front plenum 144, an air volume in a range of 89-650 CFM with a respective static pressure in a range of 0.01-0.5 inches $H_2O$, is provided.

Figure 3C:
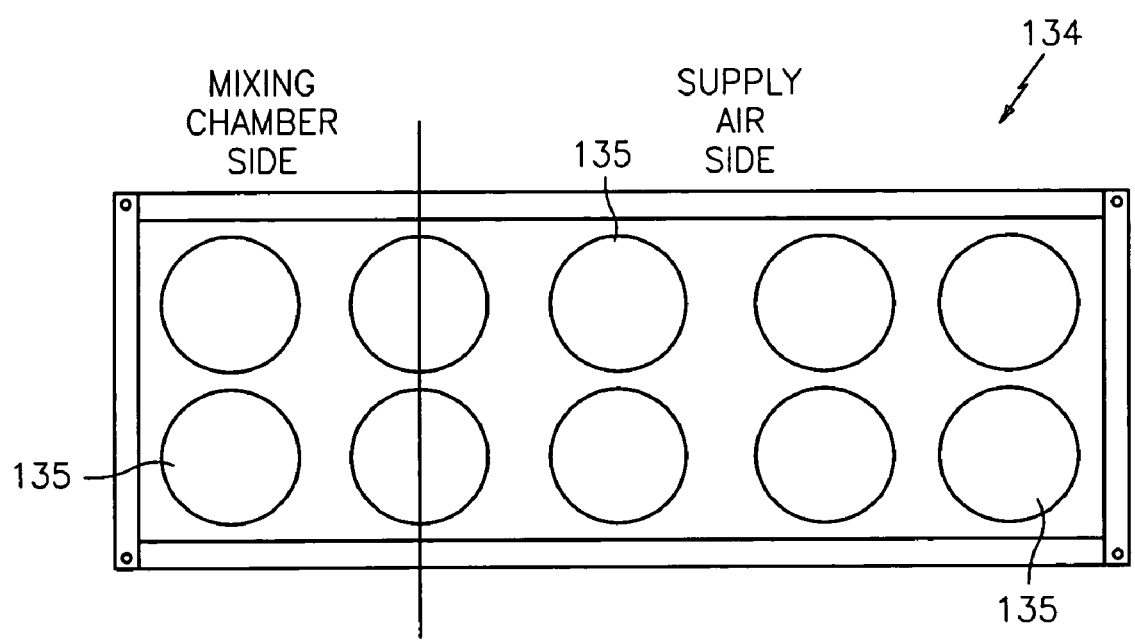
FIG. 3C is a plan view of another alternate embodiment of the base panel shown in FIG. 3A.
Figure 4:
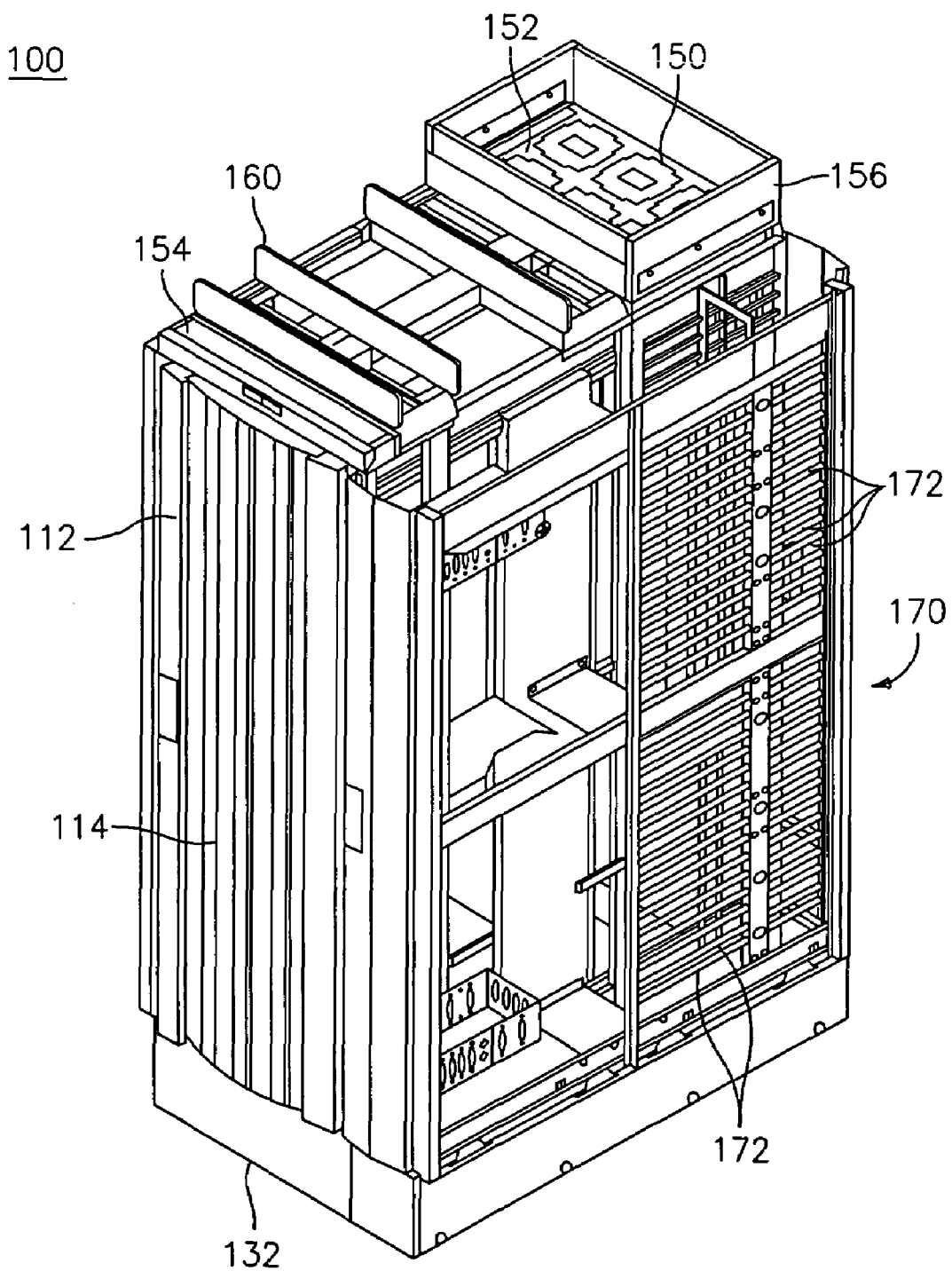
FIG. 4 is a front perspective view of an alternate embodiment of the cabinet system shown in FIG. 1 with panels removed.
Figure 5:
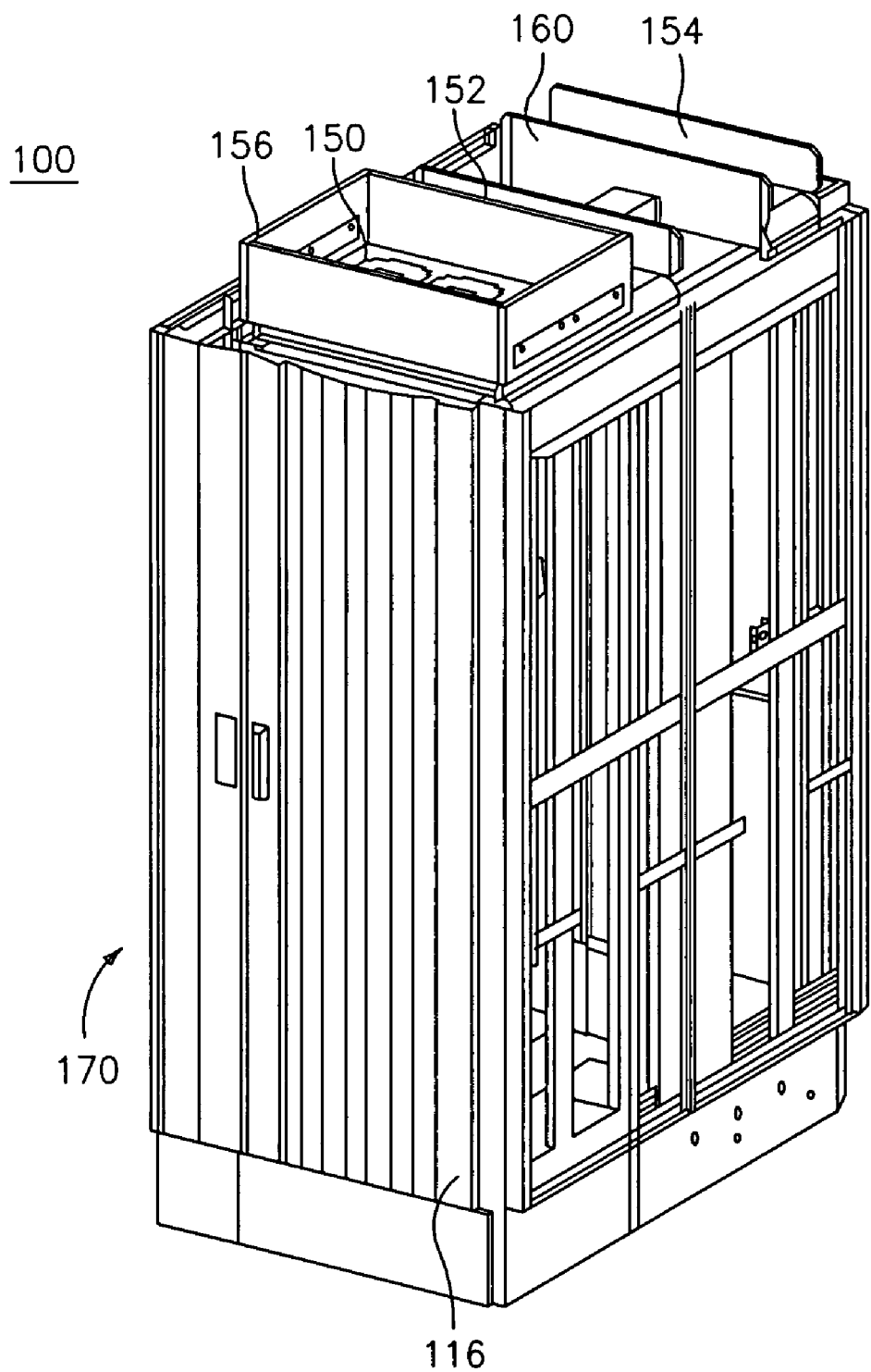
FIG. 5 is a rear perspective view of the cabinet system shown in FIG. 3 with panels removed.
Figure 6:
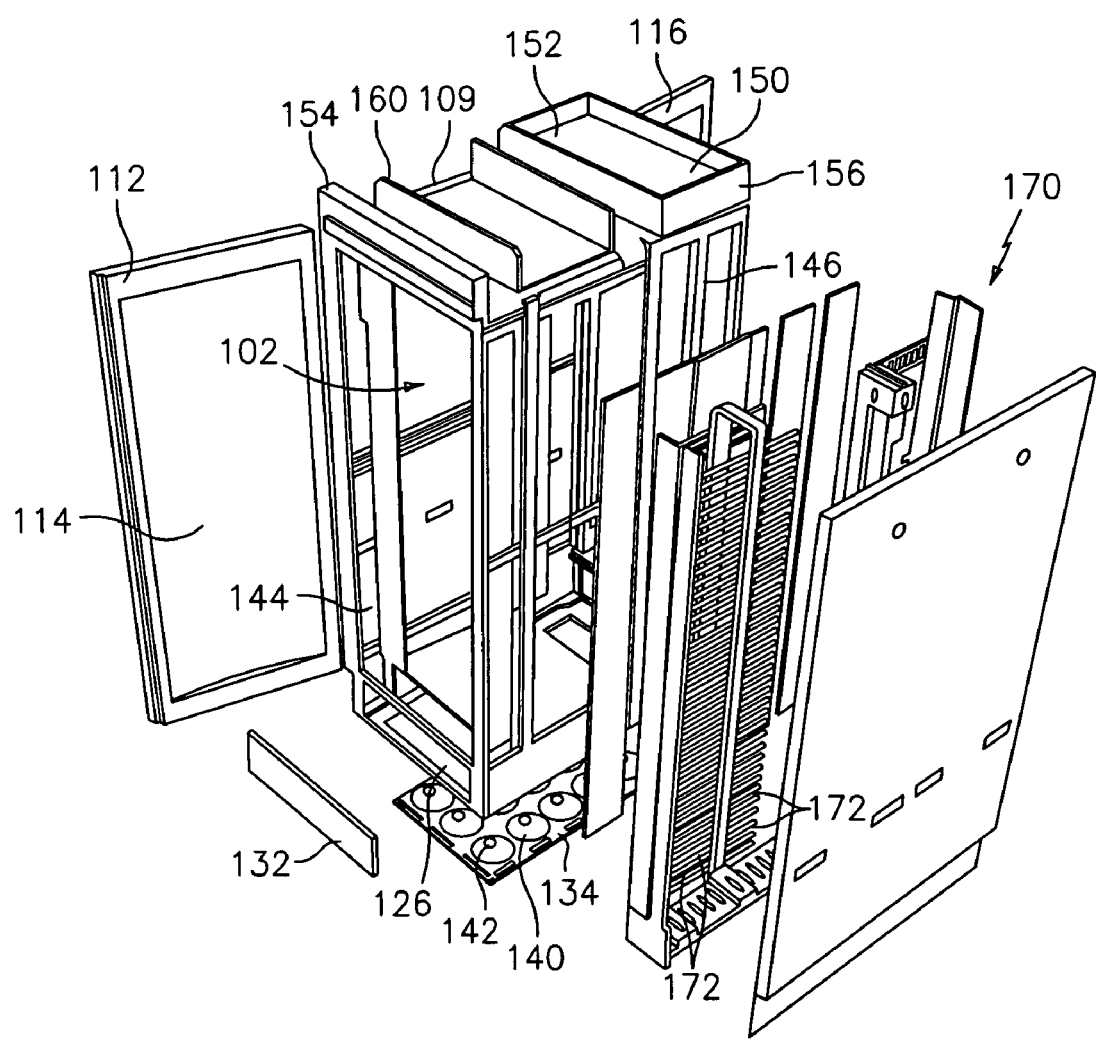
FIG. 6 is a front perspective view of the cabinet system shown in FIG. 3 with parts separated.
Figure 7:
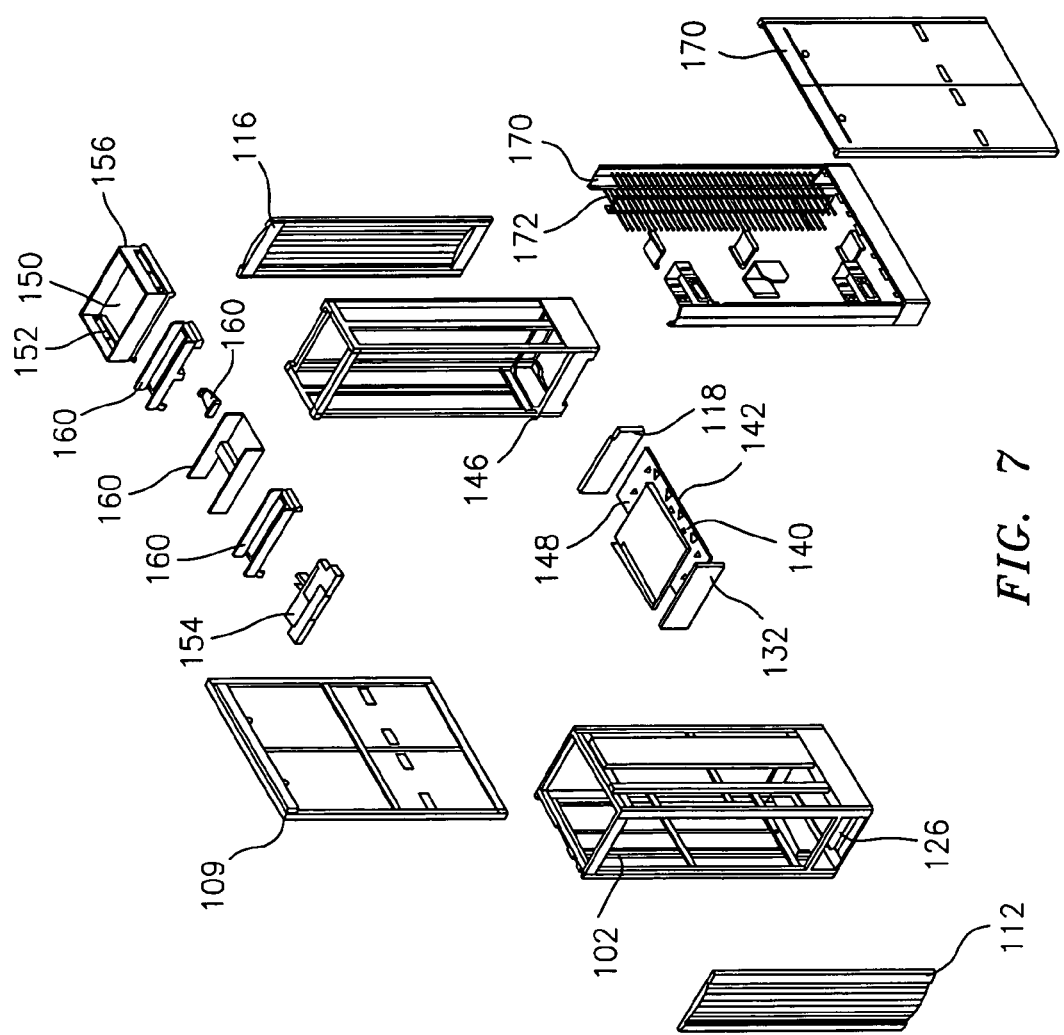
FIG. 7 is a perspective view of the cabinet system shown in FIG. 3 with parts separated.

In another embodiment as shown in FIG. 3C, the grommets are removed such that base panel 134 defines ten (10) openings 135. The openings each define an open area of approximately 34.84 square inches, resulting in a total open area of approximately 348.4 square inches. In this embodiment, on the mixing chamber side corresponding to rear plenum 146, an air volume in a range of 291-2055 CFM with a respective static pressure in a range of 0.01-0.5 inches $H_2O$, is provided. On the supply air side corresponding to front plenum 144, an air volume in a range of 678-4795 CFM with a respective static pressure in a range of 0.01-0.5 inches $H_2O$, is provided.

Gas flow distribution pathway 124 includes a front plenum 144 disposed between front wall 108 and racks 120. First section 128 directs the cool air to front plenum 144. The cool air from front section 128 and the ambient air from baffle 114 combine in front plenum 144 in a mixture of intake gas flow according to the processor control for a set temperature, as will be discussed. It is contemplated that apertures 142 and baffle 114 may be adjusted for various mixtures of cool air and ambient air. It is contemplated that the ambient air may be supplied in a temperature range of 60-90 degrees F. Other temperature ranges are also contemplated according to the requirements of a particular cabinet application.

Front plenum 144 is configured to divert and direct the intake gas flow to racks 120. The intake gas flow directs the cool air mixture about the surfaces of the heat generating blade servers 122. The cool air of the intake gas flow absorbs heat thereby maintaining an acceptable working temperature for blade sensors 122 and avoids overheating. As the intake gas flow absorbs heat, the gas flow transforms into a high temperature gas flow, which is exhausted from racks 120. It is contemplated that the high temperature gas may be in a temperature range of 70-130 degrees F. Other temperature ranges are also contemplated according to the requirement of a particular cabinet application.

Gas flow distribution pathway 124 further includes a rear plenum 146 disposed between rear wall 110 and racks 120. The high temperature gas flow from racks 120 is directed to and received within rear plenum 146. Ambient air flows through intake grill 118 and is directed into rear section 130, as shown by arrows AA. Grommets 148 including apertures 142, regulate the flow of cool air into rear section 130.

Rear section 130 directs cool air and ambient air to rear plenum 146. The cool air and ambient air from rear section 130 and the high temperature gas flow from racks 120 combine in rear plenum 146 in a mixture of exhaust gas flow. The mixture of cool air from rear section 130 is processor controlled via apertures 142.

A plurality of fans 150 are disposed with top portion 104 and mounted in alignment with rear plenum 146. Fans 150 are arranged in a configuration to remove the exhaust gas flow from rear plenum 146. Fans 150 are processor controlled such that the fan speed of fans 150 can be varied according to temperature requirements for a particular application. Fans 150 direct exhaust gas flow to outside of cabinet 100. It is envisioned that fans 150 are variable speed fans and may operate in a range of CFM output up to 2900 CFM.

A temperature sensor 152 is disposed with top portion 104, adjacent fans 150, and are mounted to sense the temperature of the exhaust gas flow. A thermal control module 154 is disposed with top portion 104 and mounted adjacent front wall 108. Thermal control module 154 communicates with temperature sensor 152 and is connected therewith to receive temperature data for the exhaust gas flow. Top portion 104 includes a tray 156, which is mounted to cabinet 100 and configured to support fans 150 and temperature sensor 152. Tray 156 is mounted with an opening 158 of rear plenum 146 such that fans 150 can draw exhaust gas flow therethrough. Top portion 104 also includes a cable tray assembly 160 configured to support cables, etc. connected with blade servers 122.

Thermal control module 154 is a processor controlling module configured for managing conditions of interior space 102, including regulating the temperature of the exhaust flow. Thermal control module 154 regulates exhaust gas flow temperature via operation control of baffle 114, grommets 140, 148 with adjustable apertures 142, and fans 150. Thermal control module 154 collects temperature data from temperature sensor 152 and supplies such data to its processor. The processor compares such data with a predetermined exhaust gas flow set point temperature. The set point temperature is pre programmed into thermal control module 154.

It is envisioned that based on the comparison of temperature server data with the set point temperature, thermal control module 154 sends out signals to the temperature regulation components, e.g., baffle 114, grommets 140, 148 with apertures 142, and fans 150. Based on the variation of the data from the set point temperature, the processor of module 154 determines the appropriate combination of operation of temperature regulation components. It is contemplated that the set point temperature may be in a temperature range of 65-100 degrees F. Other temperature ranges are also contemplated according to the requirements of a particular cabinet application.

Thermal control module 154 continues temperature maintenance and control during operation of the electronic equipment housed and maintained by cabinet 100. It is contemplated that cabinet 100 and its components cooperate with the CRAC and CRAH units associated with cabinet 100. This includes the operating parameters of the CRAC and CRAH units such as supply air temperature, return air temperature and the associated change in temperature or delta T, to regulate the internal temperature of cabinet 100 for a suitable operation of the electronic equipment housed and maintained therein.

In an alternate embodiment, as shown in FIG. 3, cabinet 100 includes a plenum duct extension 162, which is disposed with top portion 104 and connected to tray 156. Plenum duct extension 162 is connected with tray 156 in a configuration to exhaust gas flow directly into a ceiling air return duct 164 as shown by arrows G, which is connected with plenum duct extension 162. Ceiling air return duct 164 is disposed above a suspended ceiling 166 disposed above cabinet 100. Ceiling air return duct 164 returns exhaust gas flow to the air conditioning unit for cooling.

Referring to FIGS. 4-7, in another alternate embodiment, cabinet 100 includes a sidecar assembly 170, which is mounted with side wall 111. Sidecar assembly 170 is configured to support cables, etc. of blade servers 122. Sidecar assembly 170 provides cabinet 100 with the capability to handle increased cabling in a datacenter and reduces the negative impact cabling has on thermal capacity, in particular, heat dissipation in cabinet 100.

Sidecar assembly 170 has an external cable management configuration for passive, high density and extreme high density enclosures, which removes the bulk of cabling and power out of cabinet 100. Sidecar assembly 170 includes brushes 172, which support cables and other components as required.

Brush 172 support the various cables, etc. to maximize airflow by segregating the cables from cabinet 100. This increases data cable performance and reliability by minimizing exposure to higher heat loads. This design also minimizes EMI/RFI interference. It is contemplated that sidecar assembly 170 may include bottom openings to provide under floor cable access.

Figure 8:
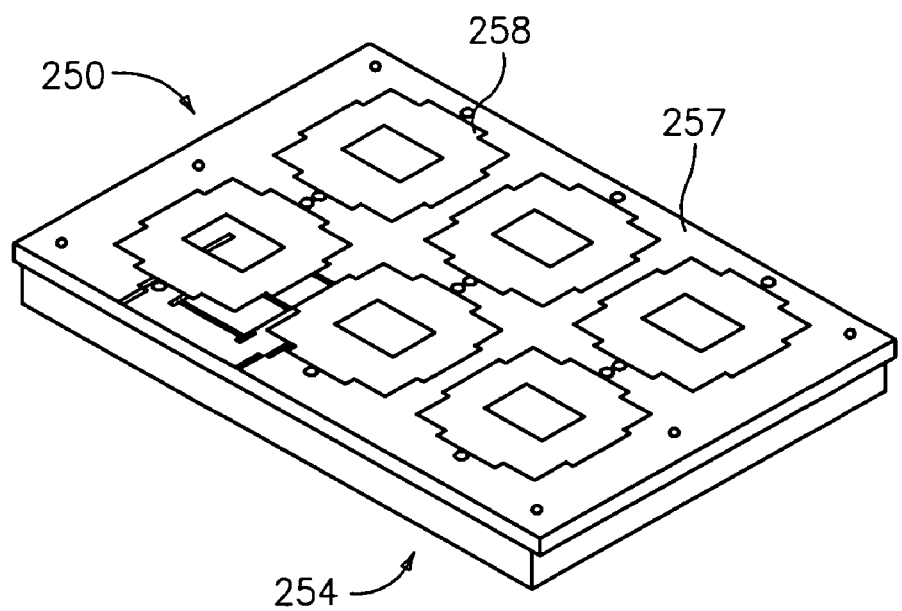
FIG. 8 is a perspective view of an alternate embodiment of a fan assembly of the cabinet system shown in FIG. 1 with parts separated.
Figure 9:
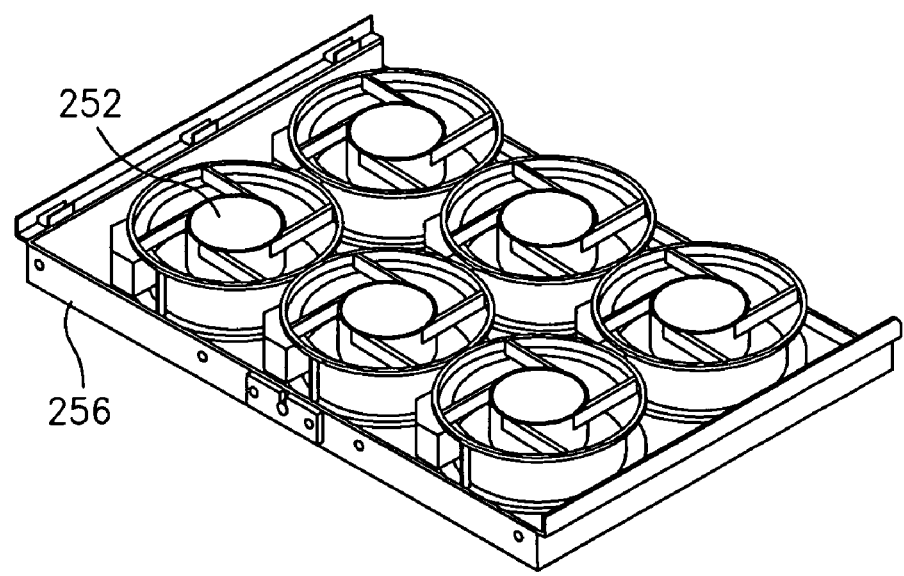
FIG. 9 is a perspective view of the fan assembly shown in FIG. 8 with a cover removed.

Referring to FIGS. 8 and 9, in another alternate embodiment, cabinet 100 (FIG. 1) includes a fan assembly 250, including a plurality of fans 252, similar to fans 150 described above. Fan assembly 250 includes six 290 CFM variable speed fans 252 disposed in symmetrical alignment with opening 158 for drawing exhaust gas flow from rear plenum 146, similar to that described above. Fans 252 are supported by fan assembly 250 in a casing 254. Casing 254 includes a pan 256 mounted with opening 158 (FIG. 3) and a cover 257. Cover 257 includes vents 258 aligned with fans 252 such that exhaust gas flow can be drawn throughout. Vents 258 include mesh, screen, etc. for gas passage. Fan assembly 250 may also be connected with duct 162 described above.

Figure 10:
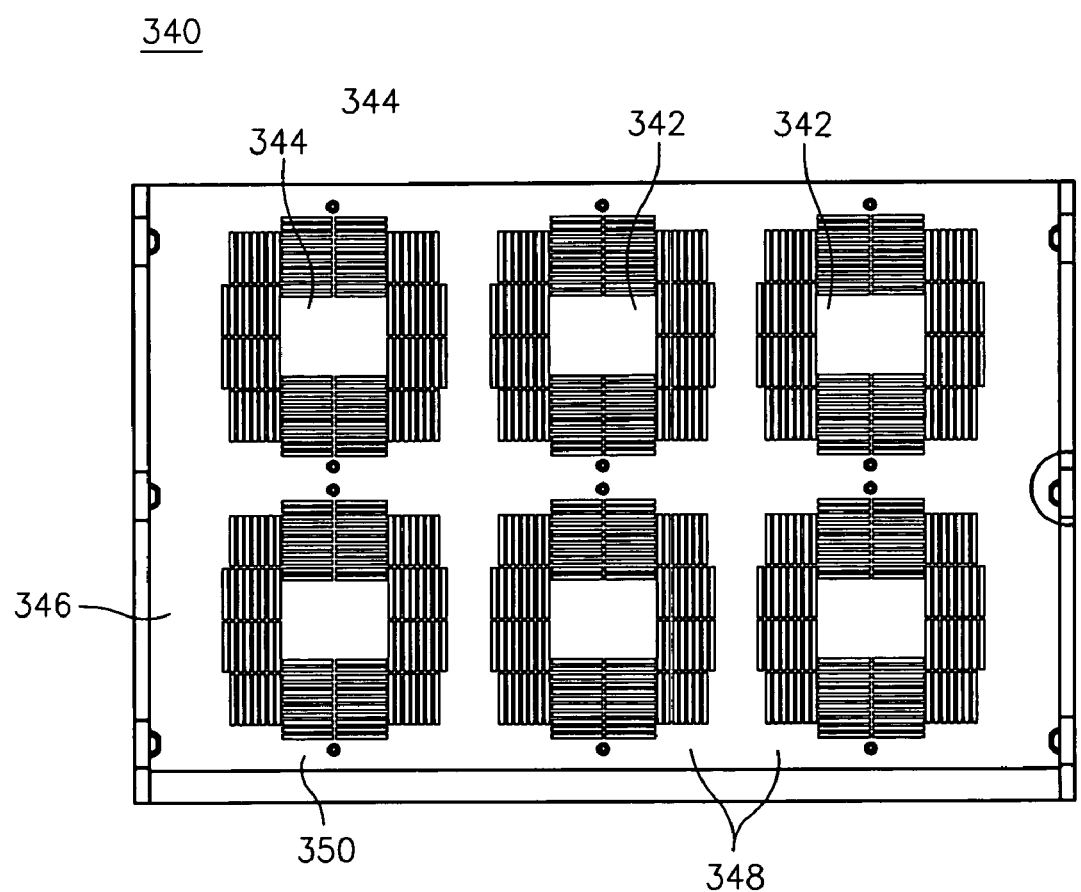
FIG. 10 is a plan view of an alternate embodiment of adjustable apertures of the cabinet system shown in FIG. 2.

Referring to FIG. 10, in another alternate embodiment, cabinet 100 includes a grommet assembly 340 having a plurality of adjustable apertures 342, 344, similar to grommets 140 described above. Grommet assembly 340 includes a plate 346, which defines grommets 348, 350. Each grommet 348, 350 defines an adjustable aperture 342, 344, respectively. Apertures 342 are aligned with front section 128 of base plenum 126 (FIG. 3) and apertures 344 are aligned with rear section 130 (FIG. 3). Apertures 342, 344 are configured for passage of cooled air therethrough.

In use, cabinet 100 is configured for maintaining electronic equipment, such as, for example, blade sensors 122 at a predetermined set point temperature according to an acceptable working temperature for a particular application. Cabinet 100, similar to those described above, is disposed in a room, such as a computer room or similar electronic equipment storage space.

Blade servers 122 generate heat during operation. Thermal control module 154 is pre-programmed for a set point temperature according to an acceptable working temperature for blade servers 122. Fans 150 are cycled on to draw exhaust gas flow through opening 158 from rear plenum 146. Temperature sensors 152 senses temperature of exhaust gas flow and communicates corresponding temperature sensing data to thermal control module 154. Based on the deviation of the temperature sensed by temperature sensor 152 from the acceptable working temperature for blade servers 122, thermal control module 154 powers a combination of baffle 114, apertures 142 and fans 150. Based on the processor controlled operation of baffle 114, apertures 142 and fans 150, gas flow distribution pathway 124 maintains the acceptable working temperature for blade servers 122 within cabinet 100.

As determined by thermal control module 154, baffle 114 adjusts to draw ambient air through baffle 114 into first plenum 144, as shown by arrows C. Low temperature gas, such as, for example, cool air from an air conditioning unit is supplied to base plenum 126 from floor ducts 168 disposed below floor 138, as shown by arrows A in FIG. 3. The cool air is drawn through front section 128 and into first plenum 144, as shown by arrows B. The cool air and the ambient air mix in first plenum 144, as shown by arrows D. As controlled by thermal control module 154, fans 150 provide the necessary pressure for drawing the cool air and ambient air in the gas flow distribution pathway 124.

The cool air and the ambient air mix in first plenum 144 in an intake gas flow. The intake gas flow is drawn across racks 120 and blade servers 122. The intake gas flow absorbs heat generated by blade servers 122 and exits racks 120 in a high temperature gas flow, as shown by arrows E. The high temperature gas flow is drawn into rear plenum 146 from the pressure of fans 150.

Cool air and ambient air are drawn through rear section 130, as discussed, into rear plenum 146 from the pressure of fans 150. Cool air and ambient air are drawn into rear plenum 146 in a mixture of exhaust gas flow, as shown by arrows F. Fans 150 draw the exhaust gas flow out of rear plenum 146 through opening 158.

Figure 11:
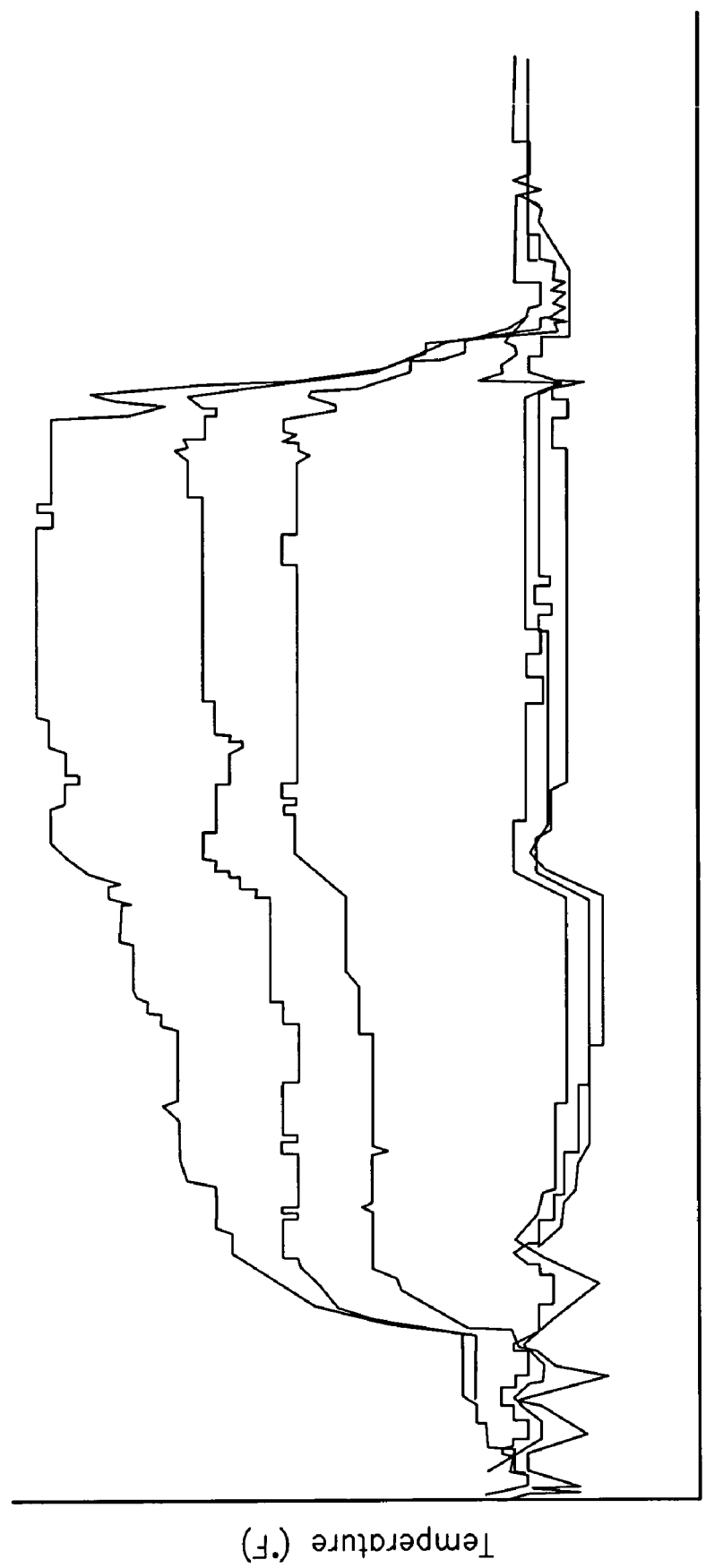
FIG. 11 is a temperature graph illustrating test results of the cabinet system shown in FIG. 1.

Temperature sensor 152 senses the temperature of the exhaust gas flow drawn from rear plenum 146. The data relating to the temperature of the exhaust gas flow is communicated to thermal control module 154. The data is compared to the preprogrammed set point for the acceptable working temperature of blade server 122. Based on the deviation from the set point temperature, thermal control module 154 powers a combination of baffle 114, apertures 142 and fans 150, as described. Thermal control module 154 continues this operation loop for maintaining acceptable working temperature during operation of blade servers 122 stored within cabinet 100. A temperature graph illustrates the temperature maintenance relating to the gas flow distribution pathway 124 of cabinet 100, as shown in FIG. 11, whereby cabinet 100 maintains optimal conditions for blade sensors 122. The cabinet system actively monitors and balances internal heat loads, utilizing under-floor cool air and ambient computer room temperature, ensuring a stable and reliable operating environment.

It is envisioned that cabinet 100 has a capacity for heat loads of up to six 7RU blade chassis. It is contemplated that the fan assembly may include 10 290-CFM variable-speed fans, which automatically adjust to varying heat loads In another alternate embodiment, cabinet 100 may include a thermal module having an input/output micro controller. The micro controller is adapted to control and monitor a plurality of variants with cabinet 100. Such variants may include temperature, power, door access, vibration, humidity, fan speed, and other measurable and controllable elements within cabinet 100. The micro controller receives power from a cabinet power supply. The micro controller may include a visual display to convey visual information to an operator of cabinet 100. This enables the operator in close proximity of cabinet 100 to monitor variants within the cabinet. In addition, the micro controller may include a visual display to convey a message to the operator. Various inputs may be programmed into the micro controller, such as temperature, power, humidity, fan speed, leakage, alarm, etc.

Accordingly, it is to be understood that the embodiments of the invention herein described are merely illustrative of the application of the principles of the invention. Reference herein to details of the illustrated embodiments is not intended to limit the scope of the Claims.

What is claimed is:

1. An electronic equipment cabinet comprising:
an enclosure defining an interior space and having an upper portion and a lower portion;
a support being disposed with the interior space and being configured to receive electronic equipment,
the lower portion defining a base plenum configured to receive a low temperature gas, the base plenum communicating with a gas flow distribution pathway of the enclosure,
the gas flow distribution pathway including a first plenum communicating with the base plenum and being configured to direct the low temperature gas to the support,
the gas flow distribution pathway further including a second plenum configured to receive a high temperature gas flow from the support and direct the high temperature gas flow to the upper portion of the enclosure, the upper portion of the enclosure including at least one fan configured to direct the high temperature gas flow from the gas flow distribution pathway, the enclosure includes a front wall and the rear wall, the front wall includes a baffle configured to regulate gas flow from outside of the enclosure to the gas flow distribution pathway in the first plenum in a mixture with the low temperature gas flow;

a temperature sensor being disposed within the enclosure to sense the temperature of the high temperature gas flow within the enclosure; and a control module configured to receive temperature sensing data from the temperature sensor to control the first plenum and the at least one fan for regulating temperature of the high temperature gas flow.

2. An electronic equipment cabinet according to claim 1, wherein the baffle is configured to regulate the flow of ambient air.

3. An electronic equipment cabinet according to claim 1, wherein the baffle includes a mesh screen and a separate panel.

4. An electronic equipment cabinet according to claim 1, wherein the baffle is regulated by the control module.

5. An electronic equipment cabinet according to claim 1, wherein the support includes shelving configured to receive electronic equipment.

6. An electronic equipment cabinet according to claim 1, wherein the support is configured to receive at least one blade server chassis.

7. An electronic equipment cabinet according to claim 1, wherein the base plenum includes at lease one adjustable opening configured to regulate low temperature gas flow.

8. An electronic equipment cabinet according to claim 7, wherein the control module controls the at least one adjustable opening.

9. An electronic equipment cabinet according to claim 1, wherein the top portion includes a cable trough.

10. An electronic equipment cabinet according to claim 1, wherein the support is configured to receive a plurality of blade server chassis.

11. An electronic equipment cabinet according to claim 1, wherein the base plenum includes a plurality of adjustable openings configured to regulate low temperature gas flow.

12. An electronic equipment cabinet according to claim 7, wherein the at least one adjustable opening is a grommet with an adjustable aperture.

13. An electronic equipment cabinet according to claim 1, wherein the top portion of the enclosure includes a plurality of fans.

14. An electronic equipment cabinet according to claim 1, wherein the rear wall includes a gas intake passageway disposed adjacent to the bottom portion of the enclosure, the gas intake passageway being configured to receive ambient air and direct the ambient air to the second plenum.

15. An electronic equipment cabinet according to claim 1, wherein the base plenum communicates with the second plenum for directing low temperature gas therein.

16. An electronic equipment cabinet according to claim 14, wherein the gas flow distribution pathway is configured to direct the high temperature gas flow, the low temperature gas flow and the ambient air in a mixture of exhaust gas flow in the second plenum such that the temperature sensor senses the temperature of the exhaust gas flow.

17. A method for maintaining electronic equipment at a predetermined temperature, comprising the steps of:

a) providing an electronic equipment cabinet, which includes, an enclosure defining an interior space and having an upper portion and a lower portion;

a support being disposed with the interior space and being configured to receive electronic equipment, the lower portion defining a base plenum configured to receive a low temperature gas, the base plenum communicating with a gas flow distribution pathway of the enclosure, the gas flow distribution pathway including a first plenum communicating with the base plenum and being configured to direct the low temperature gas to the support, the gas flow distribution pathway further including a second plenum configured to receive a high temperature gas flow from the support and direct the high temperature gas flow to the upper portion of the enclosure, the upper portion of the enclosure including at least one fan configured to direct the high temperature gas flow from the gas flow distribution pathway;

a temperature sensor being disposed with the enclosure to sense the temperature of the high temperature gas flow adjacent the upper portion of the enclosure; and a control module configured to receive temperature sensing data from the temperature sensor to control the first plenum and the at least one fan for regulating temperature of the high temperature gas flow, wherein the enclosure includes a front wall having a baffle configured to regulate a flow of ambient air from outside of the enclosure to the gas flow distribution pathway;

b) drawing ambient air through the baffle into the first plenum;

c) drawing low temperature gas through the base plenum into the first plenum;

d) mixing the low temperature gas with the ambient air in the first plenum;

e) drawing the mixed low temperature gas and the ambient air across the support such that a high temperature gas is drawn into the second plenum;

f) drawing ambient air through an intake passageway disposed adjacent a lower portion of the enclosure and into the second plenum;

g) drawing low temperature gas through the base plenum into the second plenum;

h) mixing the ambient air, the low temperature gas and the high temperature gas in the second plenum;

i) drawing the mixed ambient air, low temperature gas and the high temperature gas from the second plenum with the at least one fan;

j) sensing the temperature of the gas flow drawn from the second plenum; and k) controlling the temperature of the exhaust gas with the control module based on the temperature sensing data.

18. An electronic equipment cabinet comprising:

an enclosure including an interior space defined by a top portion, a bottom portion, a front wall and a rear wall thereof, the front wall including a baffle and the rear wall including an intake passageway;

a plurality of racks configured to support blade servers and being disposed with the interior space of the enclosure;

the bottom portion communicating with a gas flow distribution pathway of the enclosure and including a base plenum configured to receive a low temperature gas, the base plenum having a front section, a rear section, and a plurality of grommets with adjustable apertures that regulate low temperature gas flow, the gas flow distribution pathway including a front plenum disposed between the front wall and the plurality of racks, the front section of the base plenum being configured to direct a low temperature gas flow to the front plenum and the baffle regulating an ambient air flow to the front plenum in a mixture of intake gas flow, the first plenum being configured to direct the intake gas flow to the plurality of racks, the gas flow distribution pathway further including a rear plenum disposed between the rear wall and the plurality of racks, the rear plenum being configured to receive a high temperature gas flow from the plurality of racks, an ambient air flow from the intake passageway and a low temperature gas flow from the rear section of the base plenum in a mixture of exhaust gas flow;

a plurality of fans being disposed with the top portion of the enclosure in a configuration to direct the exhaust gas flow from the rear plenum;

a temperature sensor being disposed adjacent the plurality of fans to sense the temperature of the exhaust gas flow; and a control module disposed with the enclosure and communicating with the temperature sensor to receive temperature data to control the baffle, the adjustable apertures and the fans for regulating the temperature of the exhaust gas flow.

* * * * *